(12) United States Patent
Beerel et al.

(10) Patent No.: US 6,690,752 B2
(45) Date of Patent: Feb. 10, 2004

(54) SEQUENTIAL DECODER FOR DECODING OF CONVOLUTIONAL CODES

(75) Inventors: Peter A. Beerel, Westminister, CA (US); Keith M. Chugg, Burbank, CA (US); Recep O. Ozdag, Los Angeles, CA (US); Sunan Tugsinavisut, Los Angeles, CA (US); Sushil K. Singh, San Diego, CA (US); Phunsak Thiennviboon, San Diego, CA (US)

(73) Assignee: University of Southern California, Los Angeles, CA (US)

(*) Notice: Subject to any disclaimer, the term of this patent is extended or adjusted under 35 U.S.C. 154(b) by 37 days.

(21) Appl. No.: 10/040,283

(22) Filed: Oct. 22, 2001

(65) Prior Publication Data

US 2002/0097817 A1 Jul. 25, 2002

Related U.S. Application Data

(60) Provisional application No. 60/242,190, filed on Oct. 20, 2000.

(51) Int. Cl.[7] .................................................. H03D 1/00
(52) U.S. Cl. ........................ 375/341; 714/791; 714/796
(58) Field of Search ................................ 375/262, 341; 714/786, 791, 796

(56) References Cited

U.S. PATENT DOCUMENTS

| 4,998,253 A | * | 3/1991 | Ohashi et al. ............. 714/791 |
| 5,710,785 A | * | 1/1998 | Yagi .......................... 714/789 |
| 6,307,899 B1 | * | 10/2001 | Starr et al. .................. 375/340 |
| 2002/0037059 A1 | * | 3/2002 | Heegard et al. ............. 375/341 |

OTHER PUBLICATIONS

S.K. Singh, P. Thiennviboon, R. Ozdag, S. Tugsinavisut, P.A. Beerel and C.M. Chugg, "Algorithm and Circuit Co–Design for a Low–Power Sequential Decoder", ASILOMAR'99, pp. 389–394, Oct. 1999.

* cited by examiner

Primary Examiner—Amanda T. Le
(74) Attorney, Agent, or Firm—Fish & Richardson P.C.

(57) ABSTRACT

A sequential decoder for decoding convolutional code is provided. The sequential decoder includes a computing device comprising a Fano technique. The Fano technique includes a plurality of variables that are normalized to change a point of reference of the technique. One of the variables is a current node metric. The variables are normalized such that the current node metric is set to approximately zero. Methods for using this decoder in applications that include periodic, hard deadlines such as real-time applications are also presented.

19 Claims, 8 Drawing Sheets

SEQUENTIAL DECODER FOR DECODING OF CONVOLUTIONAL CODES

CROSS-REFERENCE TO RELATED APPLICATIONS

This application claims priority to U.S. provisional application Ser. No. 60/242,190, filed on Oct. 20, 2000, which is hereby incorporated by reference in its entirety.

TECHNICAL FIELD

This invention relates to digital communications, and more particularly to sequential decoders for convolutional codes.

BACKGROUND

Energy consumption in portable, battery-powered communication devices is increasingly important. Traditional design techniques have led to decoders that use fixed-complexity algorithms such as the Viterbi algorithm that perform a fixed amount of effort, and thereby consume a relatively constant amount of power, regardless of the prevailing signal-to-noise ratio (SNR) and/or fidelity requirements. The Viterbi algorithm is an optimal tree-search algorithm that determines the complete path, from the root to leaf, with maximum path metric. The properties of such fixed complexity algorithms that are traditionally viewed as advantages are regular structure, optimal decoding, and deterministic processing delay. However, since the amount of decoding effort of a fixed complexity algorithm is independent of signal-to-noise ratio (SNR) and fidelity requirements, decoders based on fixed complexity algorithms may consume inordinate amounts of power under some operating conditions such as when the SNR is high.

One example of such an application is mobile communication. In a mobile communication system, the operating characteristics may vary dramatically as a mobile unit moves across a cell. The use of a traditional fixed complexity algorithm, such as the Viterbi algorithm, in a mobile communication system may result in the waste of a significant amount of energy for decoding when the operating conditions are good.

In applications such as mobile communication, conventional sequential decoding techniques have been considered a poor alternative to traditional fixed complexity algorithms. Sequential decoding algorithms are good, suboptimal, tree-search algorithms that find a path with a metric close to the maximum path metric. Although, sequential decoding techniques typically require less average complexity and consume less average power when used with sufficiently high SNR, they are generally limited to non-real-time applications due to degradation of coding gain (at sufficiently high SNR), large variations in the required decoding effort, and associated decoding delay. In fact, when operating below the computational cut-off SNR, the decoding effort associated with conventional sequential decoders may grow prohibitively, leading to overflowing of buffers and an excessive decoded error rate. The large variations in the required decoding effort of conventional sequential decoders have made them considered to be unsuitable for applications that include periodic, hard deadlines such as real-time applications.

SUMMARY

A sequential decoder that may be used for decoding convolutional code is disclosed. The sequential decoder includes a computing device comprising a Fano technique. The Fano technique includes a plurality of variables that are normalized to change a point of reference of the technique. One of the variables is a current node metric. The variables are normalized such that the current node metric is set to approximately zero. Methods for using this decoder in applications that include periodic, hard deadlines such as real-time applications are also presented.

DETAILED DESCRIPTION

The decoding of a convolutional code with known channel parameters can be viewed as a tree-search problem. The Fano technique provides one method of decoding convolutional code. When operated with sufficiently high SNR, the Fano technique may perform near-optimal decoding of convolutional codes with significantly lower average complexity than fixed-complexity techniques such as the Viterbi technique.

Figure 1:
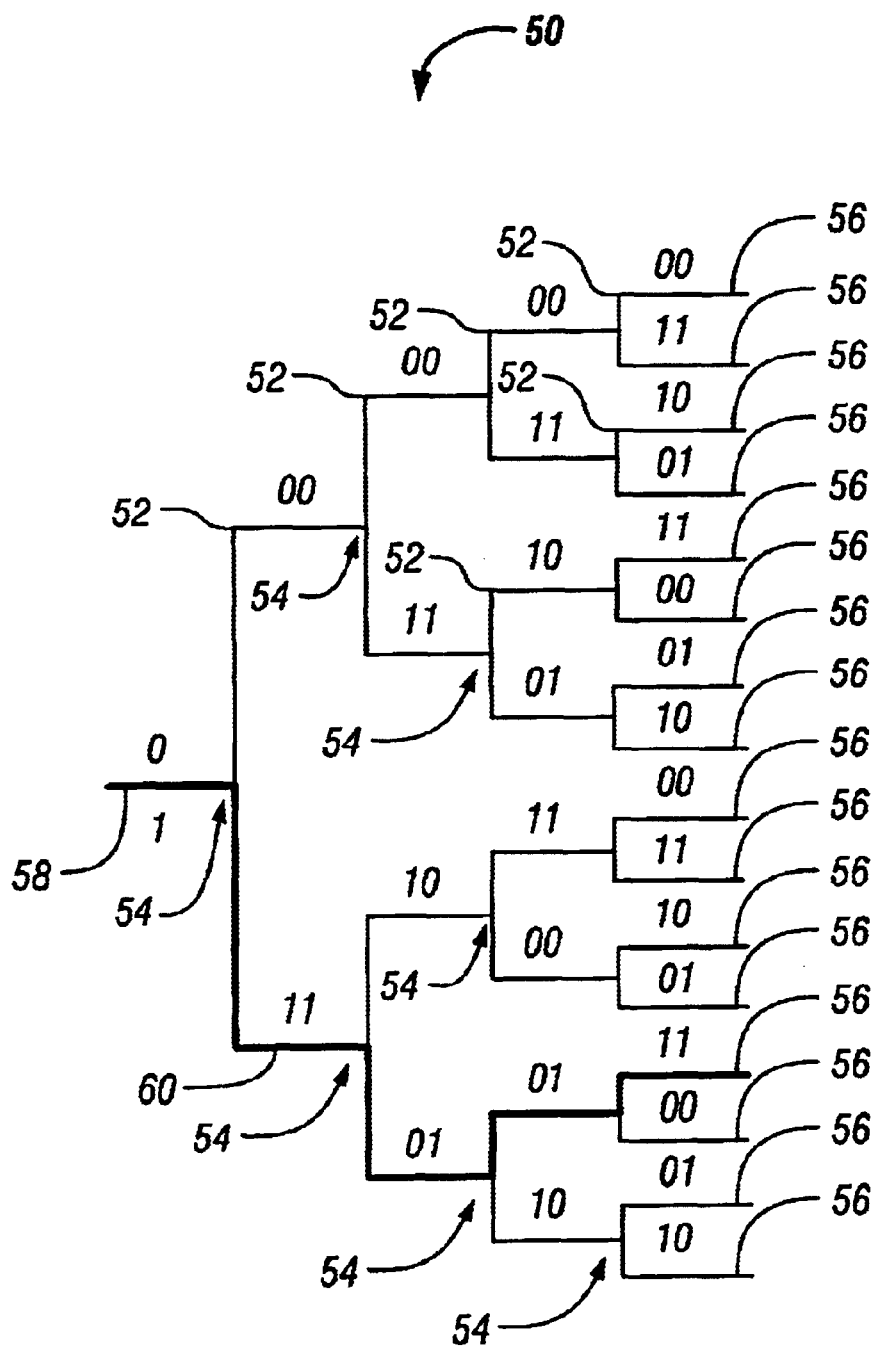
FIG. 1 is an illustration of a tree that provides a representation of possible decoded sequences.

The Fano technique is a tree-search technique. FIG. 1 shows an example of a tree 50 that provides a representation of possible decoded sequences. The tree 50 comprises nodes 52 and branches 54 that extend from a root 56 to leaf nodes 58. Associated with each branch 54 is a branch metric (or weight) that indicates the likelihood that the corresponding branch 54 lies on the optimal path. A path 60 is a sequence of nodes connected by branches 54 with the path metric defined as the sum of the corresponding branch metrics in the path 60. A current node metric is the sum of branch metrics extending along the path 60 up to the current node.

Figure 2:
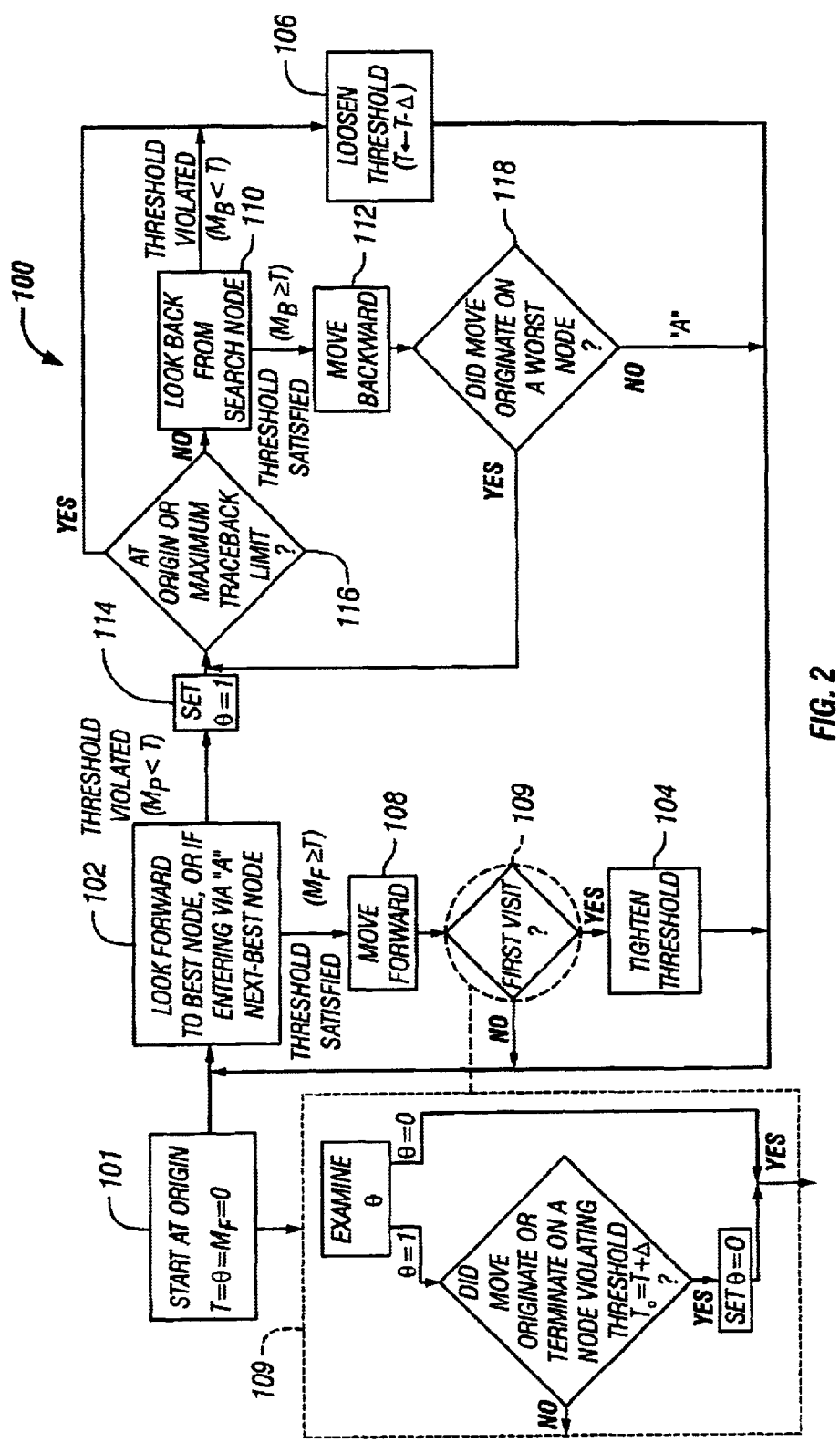
FIG. 2 is an illustration of a Fano technique.

FIG. 2 illustrates a flow chart of a Fano technique 100 for decoding convolutional code. The Fano technique searches through a tree sequentially, moving from one node to a neighboring node until a leaf node is reached. The Fano technique is a depth-first tree-search technique, meaning that it attempts to search as few paths as possible to obtain a good path. Beginning at block 101, the technique starts at the origin and initializes the threshold T. Continuing on to block 102, the metric of a path being considered is compared against the threshold T. The relation between T and the metric is determined by the statistics of the branch metrics (i.e., the underlying model) and the results of partial path exploration. The latter is reflected by dynamically adjusting the threshold to minimize the number of paths explored, blocks 104 and 106.

The basic technique includes deciding whether to move forward (deeper) or backward into the tree, and threshold adjustment. The technique moves forward when the partial path to the current node has a path weight that is greater than T, block 108. At block 109, the first visit flag, θ, is tested. Returning to block 108, if no forward branches satisfy the threshold condition, the technique sets the first visit flag, θ, at block 114 and determines whether the current node is the origin or at the traceback limit, block 116. Limiting the maximum traceback depth, limits the worst-case complexity. The technique then backtracks and searches for other partial paths that satisfy the threshold test, blocks 110 and 112. If all such partial paths are exhausted, block 118, the technique will loosen the threshold and continue, block 106. In addition, if the current partial path metric is significantly above the threshold, the technique may tighten the threshold, block 104. Threshold tightening prevents always backtracking to the root node at the cost of potentially missing the optimal path and also prevents always moving forward to the leaf along the bad path at the cost of increasing the decoding complexity and/or decoding delay.

Normalization

In one embodiment, the variables of the technique are normalized. Normalization is used to change the point of reference in the technique. The variables of the technique are normalized in such a way as to make the current node metric always equal to zero. This is equivalent to subtracting the current node metric from every variable in the technique. Since every variable is adjusted by the same amount, the overall behavior of the technique does not change. The advantages of this type of normalization in the Fano technique are as follows. 1) Additions involving the current metric (i.e., during the threshold check) are removed and comparisons with the current metric (i.e., during the first visit check and threshold tightening steps) reduce to a 1-bit sign check. 2) The normalization of the next threshold (subtracting the current node metric from it) can be done by the arithmetic logic unit (ALU) that compares the threshold with the next metric, and thus consumes negligible additional energy. 3) Lastly, the normalization allows us to work with numbers with smaller magnitudes that can be represented with fewer bits.

In traditional communication techniques, such as the Viterbi technique, normalization often causes significant performance and area overhead that hardware designers generally avoid by using slightly larger bit-widths and modulo arithmetic. In contrast, using normalization in the Fano technique may yield a smaller, faster, and more energy efficient design.

Architecture and Speculative Execution

Figure 3:
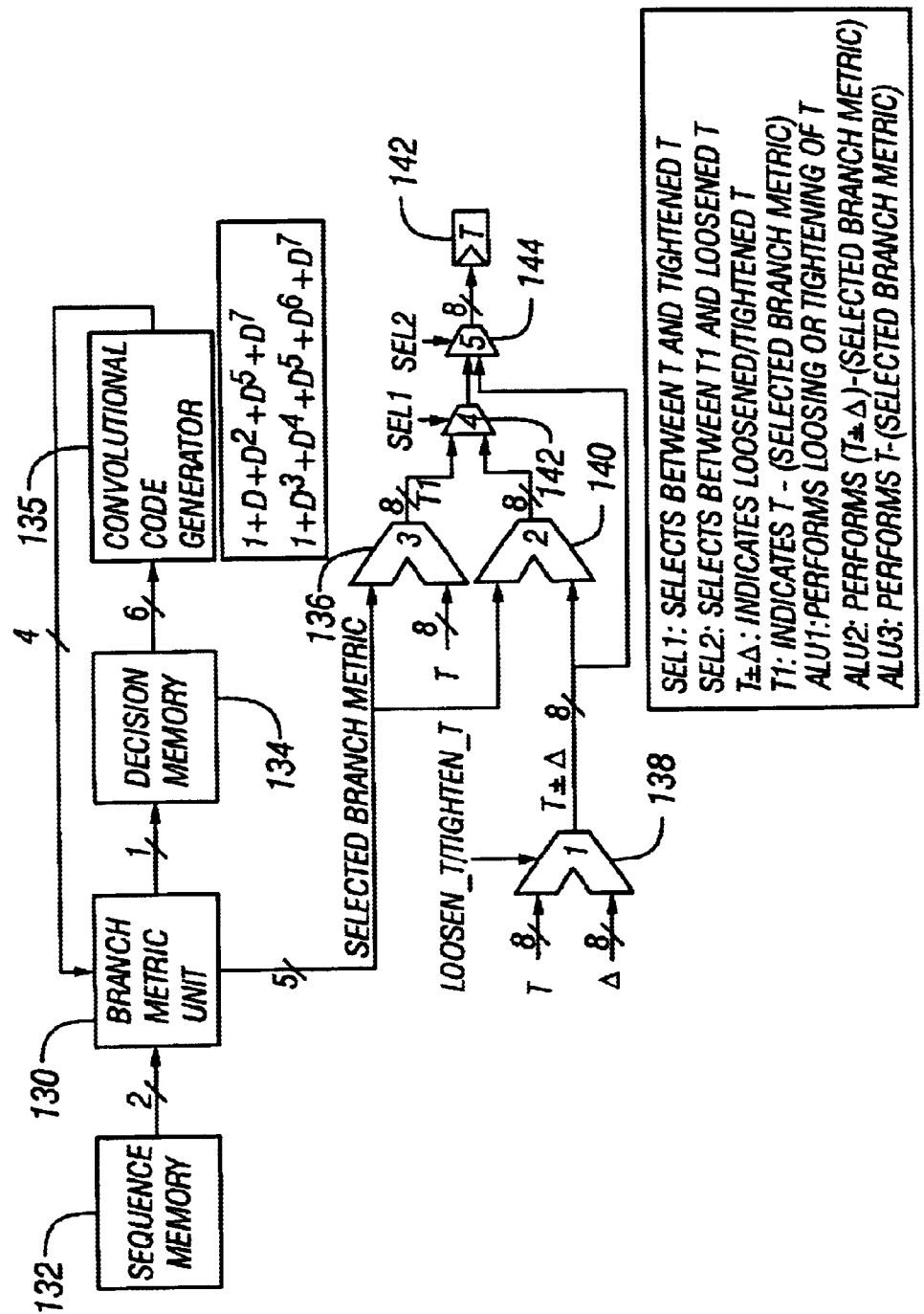
FIG. 3 is an illustration of an embodiment of a register transfer level architecture for a sequential decoder.
Figure 4:
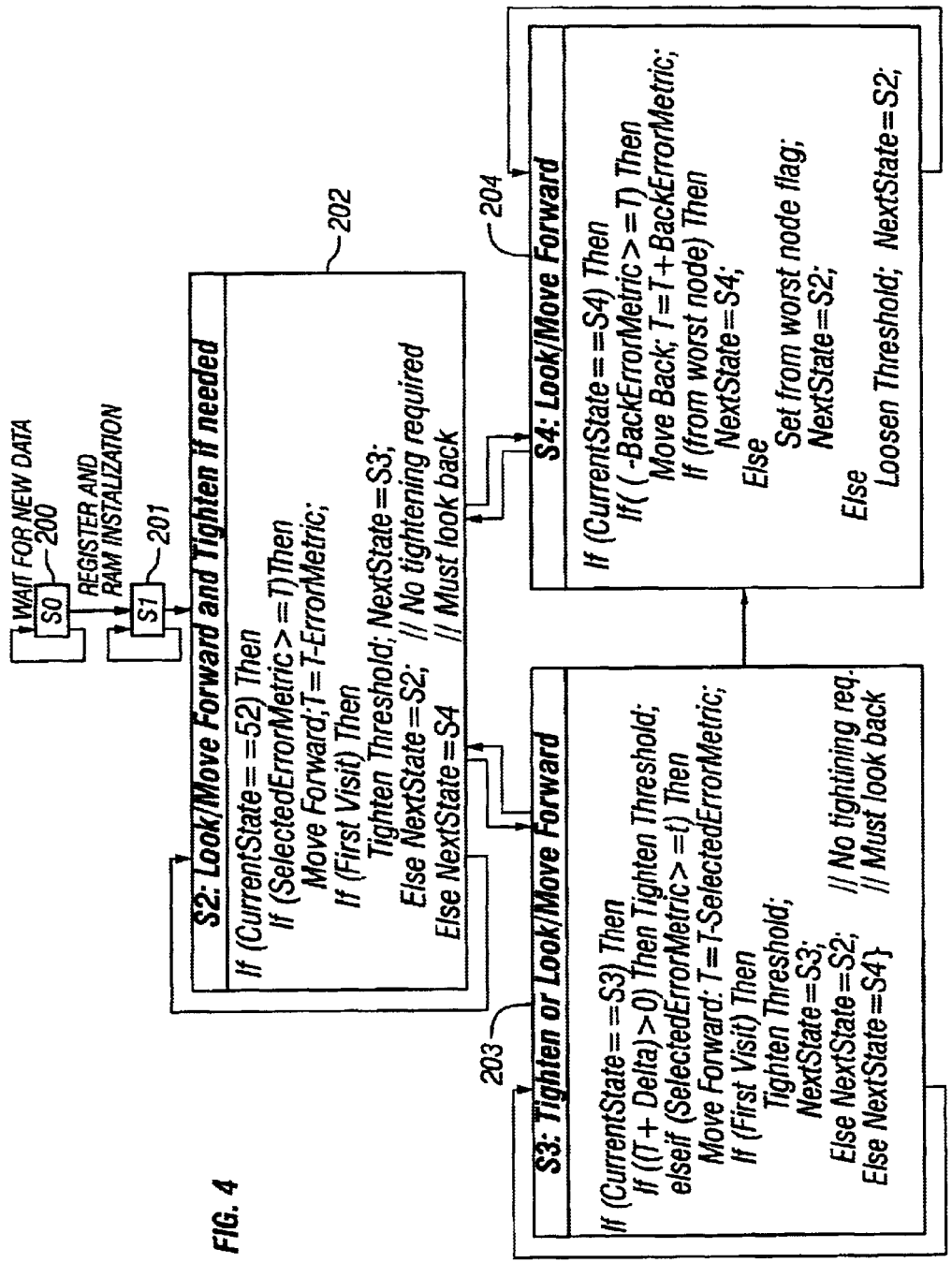
FIG. 4 is an embodiment of a finite state machine for a sequential decoder.

FIG. 3 shows a register-transfer-level RTL architecture of one embodiment of the decoder. A finite state machine (FSM) illustrated in FIG. 4 may control the RTL architecture. The RTL architecture and FSM may be embodied in any computing device including a processor, a processor/memory system, a gate array, and a programmable gate array. Beginning at State S0, block 200, the technique waits for new data. Continuing on to State S1, block 201, the registers and RAM are initialized. States S2–S4, blocks 202–204, make up the main technique. In each of these states, a branch metric unit 130 computes the selected branch metric using data that is stored in sequence memory 132. Depending on control bits (not shown) from the FSM, the selected branch metric is that associated with the best or worst branch. In either case, the corresponding input bit is sent to the decision memory 134, where, in the case the branch is taken, it is used to update the selected path. A convolutional code generator 135 computes the code based upon the selected path.

In State S2, block 202, the machine looks forward, moves forward if possible, and, if necessary, performs one step of threshold tightening. More specifically, after the selected branch metric is computed, the FSM performs a threshold check to see if the machine can move forward. That is, ALU3 136 computes T minus the selected branch metric and the FSM examines the most significant bit. If the sign bit is a 1, the branch metric is no smaller than T and the threshold check passes. Otherwise, the threshold check fails. Meanwhile, ALU1 138 and ALU2 140 speculatively compute T+Δ and T+Δ minus the selected branch metric, respectively. These values, along with θ, a state variable shown in FIG. 2, allow the FSM to determine whether the first visit check passes. That is, the first visit check passes if θ=0, or if T+Δ is positive, or T+Δ minus the selected branch metric is positive.

Based on the above results, the FSM acts in one of three ways: 1) The threshold check passes and a forward move is performed, but the first visit check fails so that NextState is set to State S2, in preparation of another look forward, 2) both the threshold check and the first visit check pass in which case NextState is set to State S3, and 3) the threshold check fails and the FSM moves to State S4, block 204, in preparation of look/move backward. In the case of 1) a threshold register 140 is updated with T minus the selected branch metric, computed by ALU3 136. In the case of 2), on the other hand, the threshold register 140 is updated with the tighter threshold T+Δ (where Δ is the threshold adjustment level), computed by ALU1 138, whereas in the case of 3) the threshold register 140 remains unchanged. In each of the cases 1–3, ALU4 142 and ALU5 144 in combination are used to select the input for the threshold register 140.

In State S3, block 203, the FSM checks whether a subsequent tightening is needed (by computing and checking the sign of Δ+T). Simultaneously, it speculatively performs a threshold check, by checking whether the Branch-Metric is no smaller than T, which is needed in the event that the threshold need not be immediately tightened (i.e., in the event that tightening of the threshold requires only the one addition of Δ performed in State S2, block 202). If tightening is required, NextState is set to State S3. For the case where no immediate tightening is needed, the FSM performs the same move/look forward/tightening/next-state operations as in State S2, block 202.

State S4, block 204, is entered when the threshold check fails in either State S2, block 202, or State S3, block 203. In State S4, block 204, a look backward is performed and, if possible, a backward move is made and the threshold is updated with the re-normalized threshold. Both the look backward and re-normalization are performed through ALU3 136 by adding T and the selected (backward) branch metric. Specifically, the look backward check is satisfied if the negative selected branch metric is greater or equal to the threshold, i.e., the result of the ALU3 136 operation is negative and the re-normalized threshold is precisely the output of ALU3 136. If a backward move is performed and it is originated from a worst node, via an additional FSM flag3, NextState is set to State S4, in preparation of another look backward. Alternatively, NextState is set to State S2 in preparation of a look forward to the next best node, controlled by a LookNextBest flag that is not shown to simplify exposition. If the backward look fails, on the other hand, the threshold is updated with a loosened threshold, speculatively computed by ALU1 138, and NextState is set to State S2.

Although a speculative control strategy is implemented in this embodiment, the decoder may be operated without speculative execution. In the described speculative control strategy, each forward move typically takes only one clock cycle with negligible performance overhead associated with the first visit check or threshold tightening. In particular, with reasonable choices of Δ, computer simulations suggest that additional cycles of tightening are rarely needed.

Branch Metric and Bit-Width Analysis

The ideal branch metrics for the Fano technique depend on the operational SNR and should be quantized for digital hardware implementation. To minimize hardware area and power consumption, we use integer branch metrics achieved by relatively standard round-off techniques that are described below.

Considering a convolutional coding system in a memoryless binary symmetric channel (BSC) channel (e.g., binary phase shift keying (BPSK) modulation over a memoryless AWGN (Additive White Gaussian Noise) channel, together with a hard-decision preprocessing) with bit error probability p, the branch metric B(h) for the Fano technique is the sum of metrics for hypothesized coded bits associated with a branch. Specifically, let C and E respectively be the bit metrics for an agreement or disagreement between the hypothesized code output and the channel bit decisions. Then, the branch metric is as follows, $$B(h)=(n-h)*C+h*E$$

where:

$C=\log_2(2(1-p))-R$, $E=\log_2(2p)-R$ where h is the number of bit disagreements or Hamming distance. Note that, in this convention, the larger path metric is the better. In this work, the metrics C and E are scaled by a positive constant so that they can be approximated by integers for the purpose of implementation. This round-off operation (i.e., scale and approximation to integers) is implemented by rounding off the bit metrics to the smallest integers within 10% round-off error.

Once the bit-width and range of the branch metrics are determined, the next step in the design is to analyze the bit-width required throughout the architecture. For a hard-decision Fano design for a rate k/n convolutional code with maximum traceback limit of D for a convolutional code with memory n (i.e., a 2n state code), the dynamic range of the normalized threshold T is $$(D-v) \cdot B(\lfloor n/2 \rfloor) + v \cdot B\beta(n) \leq T \leq 0 \qquad (1)$$

where B(i) is the branch metric assuming i channel bit decisions are incorrect.

In contrast to traditional design methodologies, the decoder minimizes average energy consumption by optimizing the design of the Fano technique for the typical operating environment.

Apdaptable Operating Parameters

Figure 5:
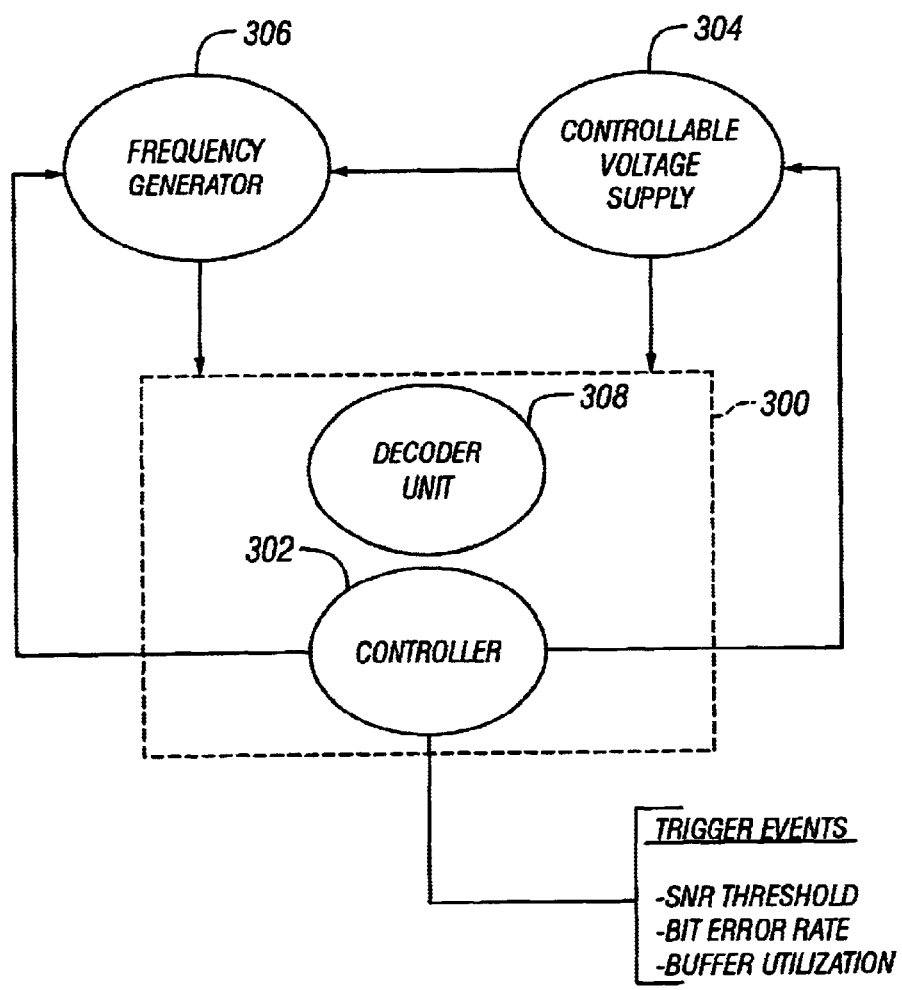
FIG. 5 is an illustration of an embodiment of a sequential decoder.

FIG. 5 shows a block diagram of one embodiment of a sequential decoder 300 for decoding convolutional code. The sequential decoder 300 may change operating parameter levels as a function of the desired speed of the technique and the average power consumption.

The sequential decoder 300 includes a decoder unit 308 to sequentially decode convolutional code. The decoder unit 308 may be based upon any technique for performing sequential decoding such as the Fano technique. A controller 302 controls the level of one or more operating parameters in response to a triggering event such as the SNR level, the error rate in the stream of data, and the utilization level of buffers used for temporary storage of input or output data. Operating parameters that may be dynamically controlled by the controller 302 include the voltage level of the supply voltage, the clock frequency, the traceback limit, and the threshold adjustment level, Δ.

Dynamic Voltage Scaling

Using dynamic voltage scaling to control the supply voltage level and the clock frequency may reduce the average power consumption of the decoder 300 while maintaining sufficient processing speed to decode the convolutional code in a real-time environment. The controller 302 controls the voltage level of the power supply 304 that supplies power to the sequential decoder 300 and frequency generator 306. By varying the voltage level of the power supply 304, the power consumed by the sequential decoder 300 is controlled.

The frequency generator 306 provides a clock signal for operating the sequential decoder 300. The frequency of the clock signal is controllable by the controller 302 so that when the voltage level of the power supply 304 is increased, the frequency of the clock signal may be increased while preserving correct operation. Matching the clock frequency to the voltage level maximizes the speed at which the sequential decoder 300 operates versus power consumption.

The power supply voltage level and the clock frequency are controlled in combination to match the speed that the sequential decoder 300 should operate at to avoid buffer overflow and meet any real-time requirements. At high SNR, the voltage level and clock frequency may be reduced to reduce power consumption. At lower SNR, the voltage level and clock frequency may need to be increased to meet real-time requirements because the number of clock cycles needed to decode the data may be larger.

Figure 6:
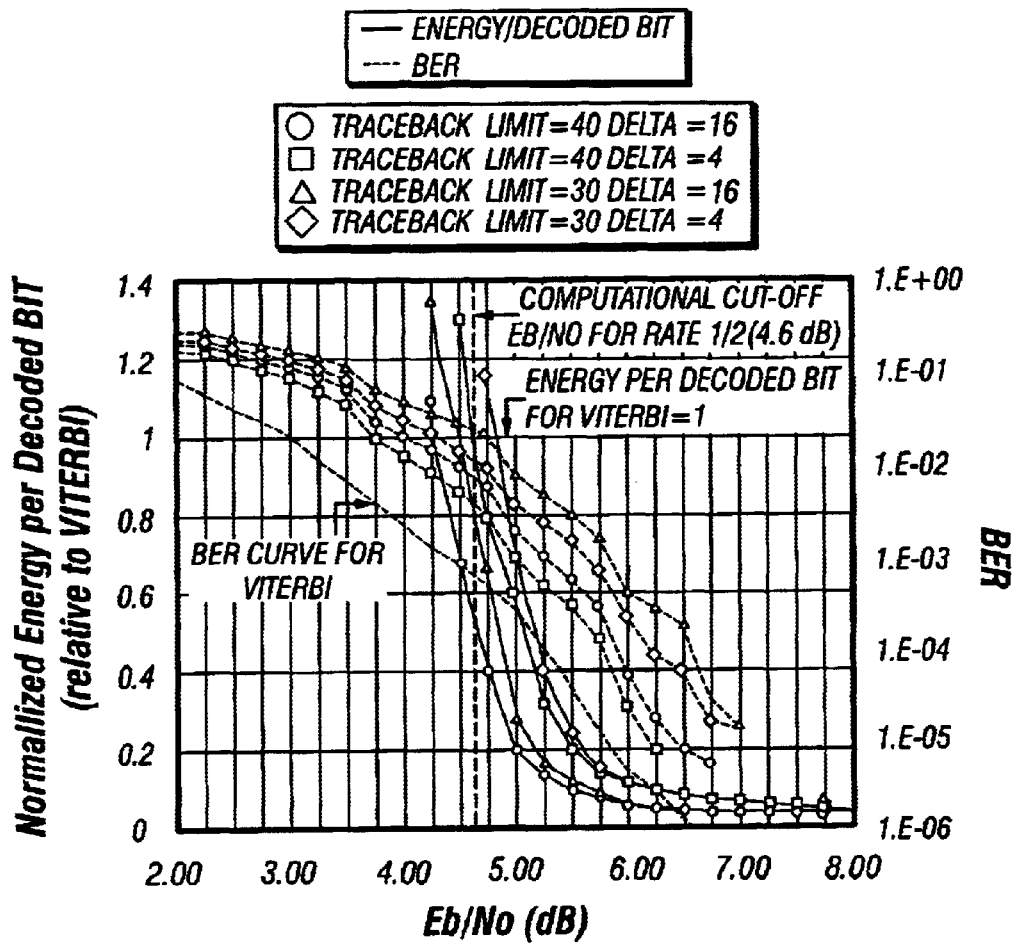
FIG. 6 is an illustration of the energy per decoded bit and the bit error rate (BER) of a Fano sequential decoder.

FIG. 6 shows the energy per decoded bit and the bit error rate (BER) of a Fano sequential decoder including normalization, speculative execution, and dynamic voltage scaling versus a baseline Viterbi design. The left y-axis shows the energy consumed per decoded bit E and the right y-axis characterizes the decoded BER, with both plotted against the $E_b/N_0$ in dB. This corresponds to a binary phase shift keying (BPSK) signaling over a memoryless AWGN channel with a packet length of 128 information bits. Four sets of curves are shown for the Fano technique, corresponding to combinations of D=4, 16 and D=30, 40. Decreasing D yields improved BER at the expense of greater average complexity. The curve with the lowest energy consumption corresponds to D=16 and D=40, which has the second best performance of the four cases making it a desirable compromise between performance and complexity. The performance degradation relative to the Viterbi technique for the four cases ranges from approximately 0.5 dB to approximately 1.5 dB in $E_b/N_0$. As expected, the effort of all Fano configurations increases dramatically as $E_b/N_0$ decreases toward the computational cut-off $E_b/N_0$. However, for $E_b/N_0$ above this value, the sequential decoders consume significantly less energy than the Viterbi decoder. For $E_b/N_0$ values larger than approximately 6 dB, all four configurations consume approximately one tenth the energy of the reference Viterbi decoder. The D=16 and D=40 configuration requires approximately 1/30 the energy per decoded bit of the Viterbi reference for $E_b/N_0 {}^3 8$ dB. The energy consumption of all configurations of the sequential decoder approach the 0.032 of that used by the Viterbi baseline for sufficiently large SNR. This is the energy required to decode with no backward moves.

Figure 7:
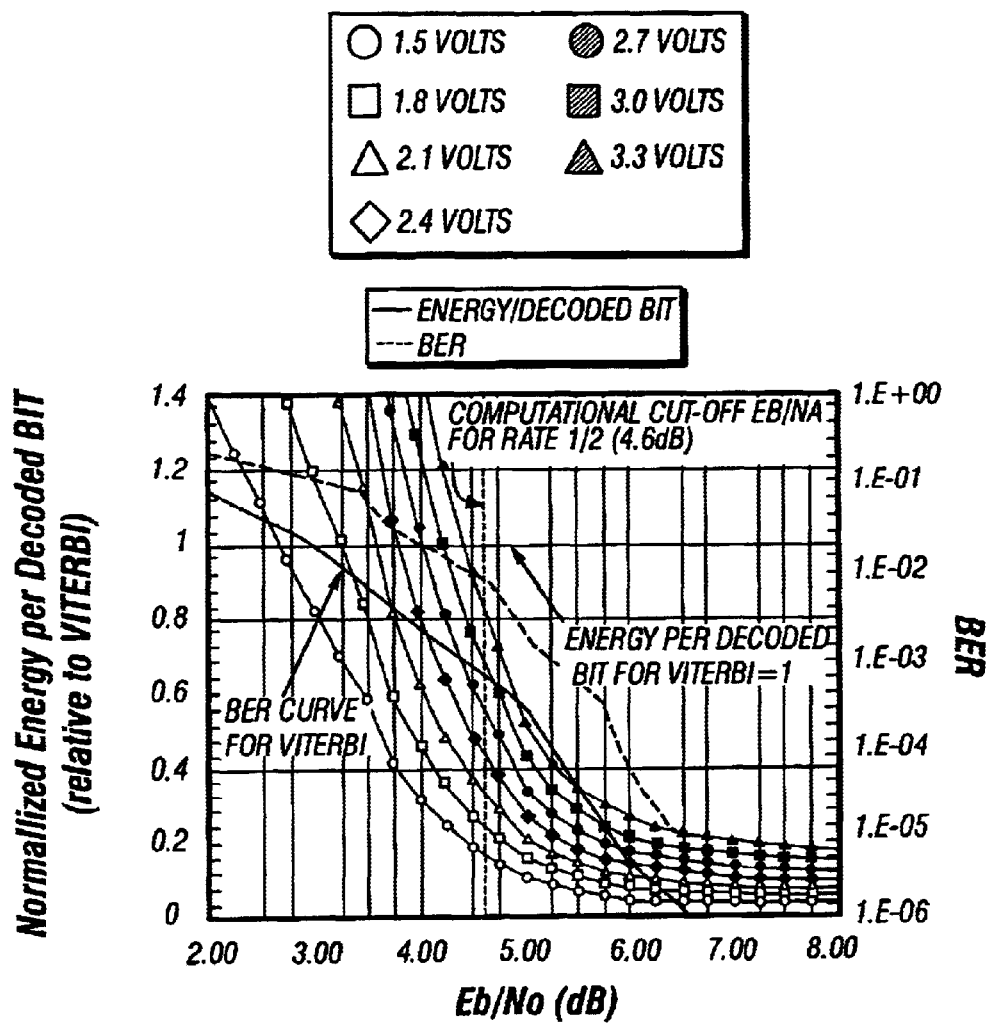
FIG. 7 is an illustration of the energy per decoded bit and the BER of a Fano sequential decoder that is operated with various fixed voltage supplies versus a baseline Viterbi decoder.
Figure 8:
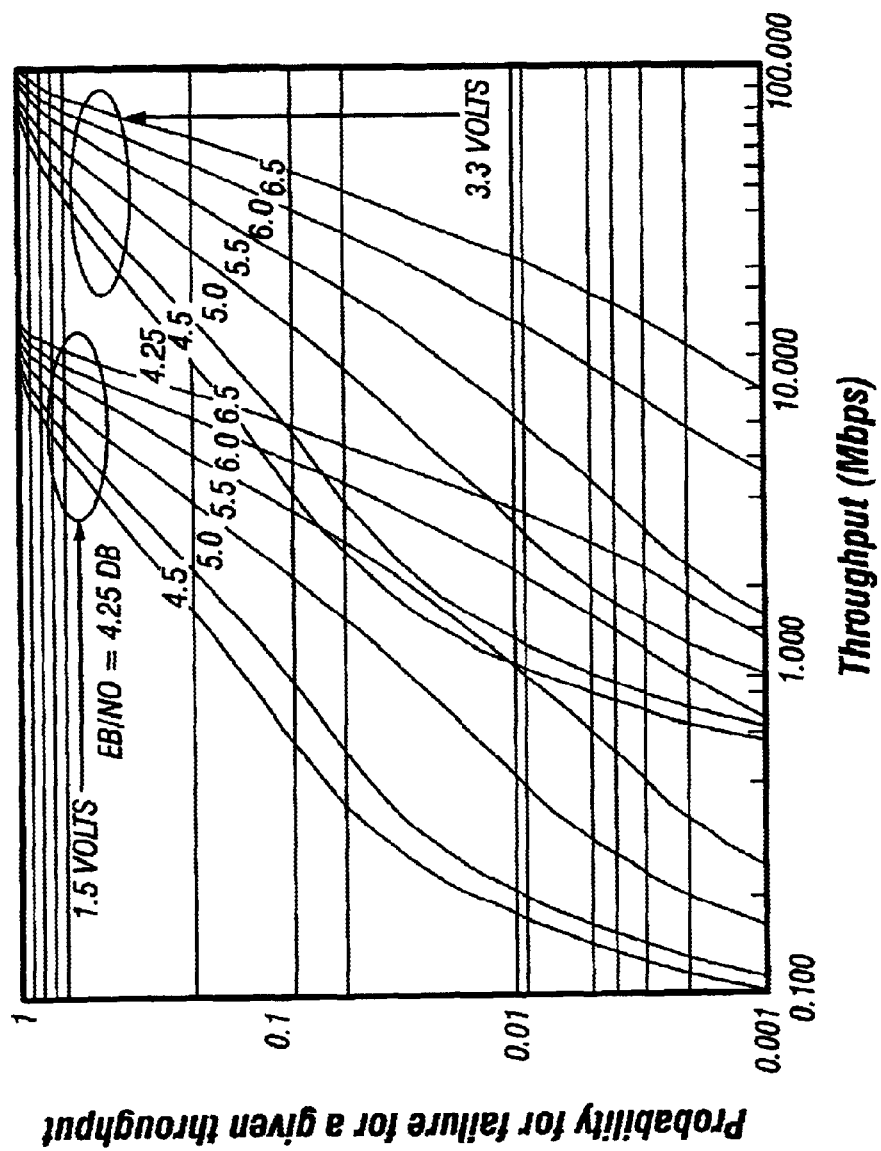
FIG. 8 is an illustration of the probability of failure for a given throughput of a sequential decoder that does not have a buffer.

FIG. 7 shows the energy per decoded bit and the BER of a Fano sequential decoder that is operated with various fixed voltage supplies versus a baseline Viterbi decoder. For each voltage supply, we computed the energy consumption compared to that of the Viterbi technique for the Fano technique with Δ=16 and D=40 and estimated the maximum clock frequency at which the chip may be successfully operated. In the worst case scenario in which there is no buffer, the probability of failure for a given throughput is computed using the discrete distribution of the required number of clock cycles/packet obtained through the extensive simulations and is illustrated in FIG. 8. These curves suggest the lowest voltage supply can be used to achieve the maximum energy saving for each fixed data rate with only a small probability of not meeting the instantaneous throughput requirement. Such failure probability may be reduced by careful design of a buffer for data packets.

A number of embodiments of the invention have been described. Nevertheless, it will be understood that various modifications may be made without departing from the spirit and scope of the invention. Accordingly, other embodiments are within the scope of the following claims.

What is claimed is:

1. A sequential decoder for decoding convolutional code, comprising:
    a computing device comprising a Fano technique, the Fano technique including a plurality of variables being normalized to change a point of reference of the technique, one of the variables being a current node metric, the variables being normalized such that the current node metric is set to approximately zero.

2. The sequential decoder of claim 1 wherein the current node metric before being normalized is subtracted from each of the variables.

3. The sequential decoder of claim 1 wherein the Fano technique is embodied in a register transfer level (RTL) architecture and a finite state machine.

4. The sequential decoder of claim 3 wherein the RTL architecture includes a branch metric unit to compute the current branch metric.

5. The sequential decoder of claim 4 wherein the RTL architecture further includes a sequence memory to store sequence data; and
    the branch metric unit computes the current branch metric based upon the sequence data.

6. The sequential decoder of claim 5 wherein the finite state machine includes a look/move forward and tighten if needed state, a tighten or look/move forward state, and a look/move back state.

7. The sequential decoder of claim 5 wherein the Fano technique includes speculative computation of at least one variable.

8. The sequential decoder of claim 7 wherein the at least one variable comprises a threshold minus a selected branch metric and the threshold plus a threshold adjustment level.

9. A sequential decoder for decoding convolutional code, comprising:
    a Fano technique embodied in a register transfer level architecture and a finite state machine, the Fano technique including speculative data execution of at least two variables of a plurality of variables.

10. The sequential decoder of claim 9 wherein the plurality of variables are normalized to change a point of reference of the technique, the variables including a current node metric, the variables being normalized such that the current node metric is set to zero.

11. The sequential decoder of claim 9 wherein the at least two variables include at least two branch metrics.

12. The sequential decoder of claim 9 wherein the at least two variables include a threshold minus a selected branch metric.

13. The sequential decoder of claim 9 wherein the at least two variables include a threshold plus a threshold adjustment level.

14. The sequential decoder of claim 9 wherein the at least two variables include a threshold plus a threshold adjustment level.

15. The sequential decoder of claim 9 wherein the register transfer level architecture and the finite state machine are implemented in a computing device.

16. The sequential decoder of claim 15 wherein the computing device is selected from the group consisting of processors and gate arrays.

17. A method of decoding convolutional code, comprising:
    using a Fano technique to decode the convolutional code, the Fano technique comprising a plurality of variables including a current node metric; and
    normalizing the variables such that the current node metric is set to zero.

18. The method of claim 17 wherein using the Fano technique further includes:
    executing a finite state machine comprising a look/move forward and tighten if needed state, a tighten or look/move forward state, and a look/move back state.

19. The method of claim 18 further including speculatively executing values for at least two of the variables.

* * * * *

UNITED STATES PATENT AND TRADEMARK OFFICE
CERTIFICATE OF CORRECTION

| | | |
|---|---|---|
| PATENT NO. | : 6,690,752 B2 | Page 1 of 1 |
| APPLICATION NO. | : 10/040283 | |
| DATED | : February 10, 2004 | |
| INVENTOR(S) | : Peter A. Beerel et al. | |

It is certified that error appears in the above-identified patent and that said Letters Patent is hereby corrected as shown below:

At column 1, line 10, please insert the following paragraph:

--FEDERALLY SPONSORED RESEARCH OR DEVELOPMENT

This invention was made with government support under Contract No. 9726391 awarded by the National Science Foundation. The government has certain rights in the invention.--

Signed and Sealed this

Thirtieth Day of December, 2008

JON W. DUDAS
*Director of the United States Patent and Trademark Office*